US006954000B2

(12) United States Patent
Hembree et al.

(10) Patent No.: US 6,954,000 B2
(45) Date of Patent: Oct. 11, 2005

(54) SEMICONDUCTOR COMPONENT WITH REDISTRIBUTION CIRCUIT HAVING CONDUCTORS AND TEST CONTACTS

(75) Inventors: David R. Hembree, Bosie, ID (US); Jorge L. de Varona, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/698,788

(22) Filed: Oct. 31, 2003

(65) Prior Publication Data

US 2004/0089954 A1 May 13, 2004

Related U.S. Application Data

(60) Continuation of application No. 10/659,828, filed on Sep. 11, 2003, which is a continuation of application No. 09/835,200, filed on Apr. 13, 2001, now Pat. No. 6,620,633, which is a division of application No. 09/473,232, filed on Dec. 24, 1999, now Pat. No. 6,380,555.

(51) Int. Cl.[7] .............................................. H01L 23/48
(52) U.S. Cl. ...................... 257/781; 257/678; 257/734; 257/738; 257/758; 257/778; 257/780
(58) Field of Search ................................ 257/678, 734, 257/738, 758, 778, 780, 781

(56) References Cited

U.S. PATENT DOCUMENTS

| | | | | |
|---|---|---|---|---|
| 3,387,365 A | * | 6/1968 | Stelmak | 29/840 |
| 3,806,801 A | | 4/1974 | Bove | |
| 5,067,007 A | | 11/1991 | Kanji et al. | |
| 5,124,639 A | | 6/1992 | Carlin et al. | |

(Continued)

OTHER PUBLICATIONS

"Cobra technology makes Wentworth Labs the world's most advanced probe card manfacturer", brochure from Wentworth Laboratories, 1996.

H. W. Lorber et al., "Non–Adhering Probe For Contacting Solder pads", IBM Technical Disclosure Bulletin, vol. 26, No. 1, Jun. 1983.

"Science Over Art. Our New IC Membrane Test Probe", Packard Hughes Interconnect brochure, 1993.

Primary Examiner—Christian Wilson
Assistant Examiner—Douglas M. Menz
(74) Attorney, Agent, or Firm—Stephen A. Gratton (57) ABSTRACT

A bumped semiconductor component includes bumped contacts, a semiconductor die having die contacts, and a redistribution circuit having conductors for establishing electrical communication between the die contacts and the bumped contacts. The redistribution circuit also includes test contacts in electrical communication with the die contacts and with the bumped contacts. The test contacts allow the die to be tested without electrical engagement of the bumped contacts. The bumped semiconductor component can be contained on a wafer, or can be a singulated component such as a flip chip package. A test system includes the bumped semiconductor component, and an interconnect having contacts configured to electrically engage the test contacts without interference from the bumped contacts. If the test contacts are aligned with the die contacts, the same interconnect can be used to test the bare die as well as the bumped component. A test method includes the steps of: providing the bumped component with test contacts; providing the interconnect with interconnect contacts configured to engage the test contacts without interference from the bumped contacts; and then testing the component by applying test signals through the interconnect contacts to the test contacts.

6 Claims, 6 Drawing Sheets

U.S. PATENT DOCUMENTS

| | | | |
|---|---|---|---|
| 5,172,050 A | 12/1992 | Swapp | |
| 5,177,439 A | 1/1993 | Liu et al. | |
| 5,180,977 A | 1/1993 | Huff | |
| 5,269,453 A | 12/1993 | Melton et al. | |
| 5,476,211 A | 12/1995 | Khandros | |
| 5,517,127 A | 5/1996 | Bergeron et al. | |
| 5,547,740 A * | 8/1996 | Higdon et al. | 428/209 |
| 5,593,927 A | 1/1997 | Farnworth et al. | |
| 5,686,317 A | 11/1997 | Akram et al. | |
| 5,736,456 A * | 4/1998 | Akram | 438/614 |
| 5,767,443 A | 6/1998 | Farnworth et al. | |
| 5,767,528 A | 6/1998 | Sumi et al. | |
| 5,786,632 A | 7/1998 | Farnworth et al. | |
| 5,792,594 A | 8/1998 | Brown et al. | |
| 5,829,128 A * | 11/1998 | Eldridge et al. | 29/855 |
| 5,849,606 A * | 12/1998 | Kikuchi et al. | 438/108 |
| 5,851,911 A | 12/1998 | Farnworth | |
| 5,892,179 A * | 4/1999 | Rinne et al. | 174/261 |
| 5,894,161 A | 4/1999 | Akram et al. | |
| 6,011,314 A * | 1/2000 | Leibovitz et al. | 257/781 |
| 6,060,891 A | 5/2000 | Hembree et al. | |
| 6,078,186 A | 6/2000 | Hembree et al. | |
| 6,097,087 A * | 8/2000 | Farnworth et al. | 257/698 |
| 6,204,455 B1 | 3/2001 | Gilleo et al. | |
| 6,218,281 B1 | 4/2001 | Watanabe et al. | |
| 6,255,833 B1 | 7/2001 | Akram et al. | |
| 6,261,854 B1 | 7/2001 | Akram et al. | |
| 6,275,052 B1 | 8/2001 | Hembree et al. | |
| 6,287,893 B1 * | 9/2001 | Elenius et al. | 438/108 |
| 6,297,653 B1 | 10/2001 | Hembree | |
| 6,300,782 B1 | 10/2001 | Hembree et al. | |
| 6,300,786 B1 | 10/2001 | Doherty et al. | |
| 6,314,641 B1 | 11/2001 | Akram | |
| 6,337,577 B1 | 1/2002 | Doherty et al. | |
| 6,359,456 B1 | 3/2002 | Hembree | |
| 6,362,637 B2 | 3/2002 | Farnworth et al. | |
| 6,366,112 B1 | 4/2002 | Doherty et al. | |
| 6,372,627 B1 | 4/2002 | Ring et al. | |
| 6,380,555 B1 | 4/2002 | Hembree et al. | |
| 6,383,825 B1 | 5/2002 | Farnworth et al. | |
| 6,414,506 B2 | 7/2002 | Akram et al. | |
| 6,429,029 B1 | 8/2002 | Eldridge et al. | |
| 6,456,099 B1 | 9/2002 | Eldridge et al. | |
| 6,469,537 B1 | 10/2002 | Akram et al. | |
| 6,603,324 B2 | 8/2003 | Eldridge et al. | |
| 6,620,633 B2 | 9/2003 | Hembree et al. | |
| 2004/0048401 A1 | 3/2004 | Hembree et al. | |

* cited by examiner

SEMICONDUCTOR COMPONENT WITH REDISTRIBUTION CIRCUIT HAVING CONDUCTORS AND TEST CONTACTS

CROSS REFERENCE TO RELATED APPLICATIONS

This application is a continuation of Ser. No. 10/659,828, filed Sep. 11, 2003, which is a continuation of Ser. No. 09/835,200, filed Apr. 13, 2001, U.S. Pat. No. 6,620,633, which is a division of Ser. No. 09/473,232, filed Dec. 24, 1999, U.S. Pat. No. 6,380,555 B1.

FIELD OF THE INVENTION

This invention relates generally to semiconductor manufacture and testing. More particularly, this invention relates to a bumped semiconductor component having test pads, and to a method and system for testing bumped semiconductor components.

BACKGROUND OF THE INVENTION

Semiconductor components, such as bare semiconductor dice, semiconductor packages, chip scale packages, BGA devices, and semiconductor wafers can include terminal contacts in the form of bumps. This type of component is sometimes referred to as a "bumped" component (e.g., bumped die, bumped package, bumped wafer).

Figure 1:
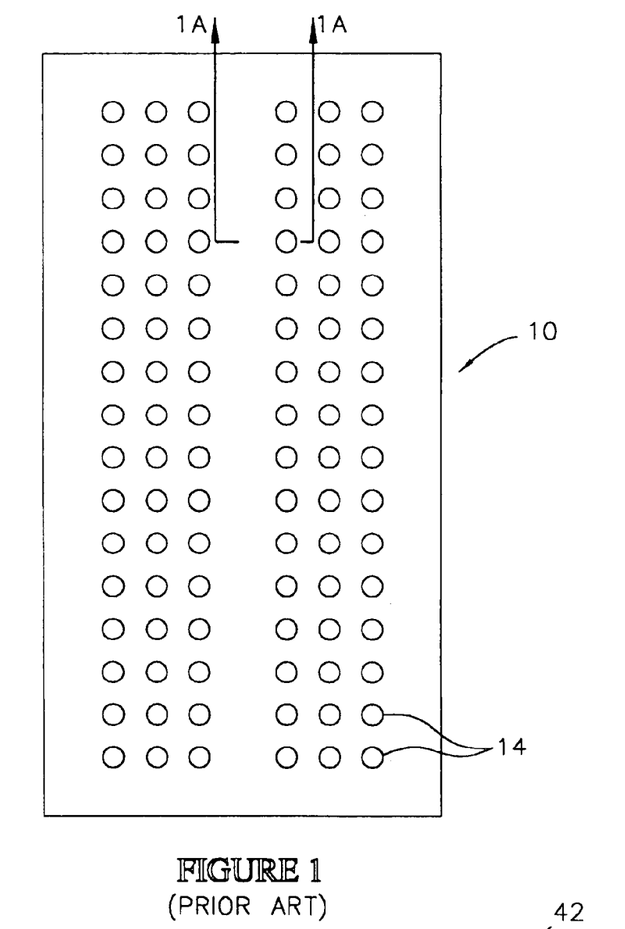
FIG. 1 is a bottom view of a prior art semiconductor package having external bumped contacts.
Figure 1A:
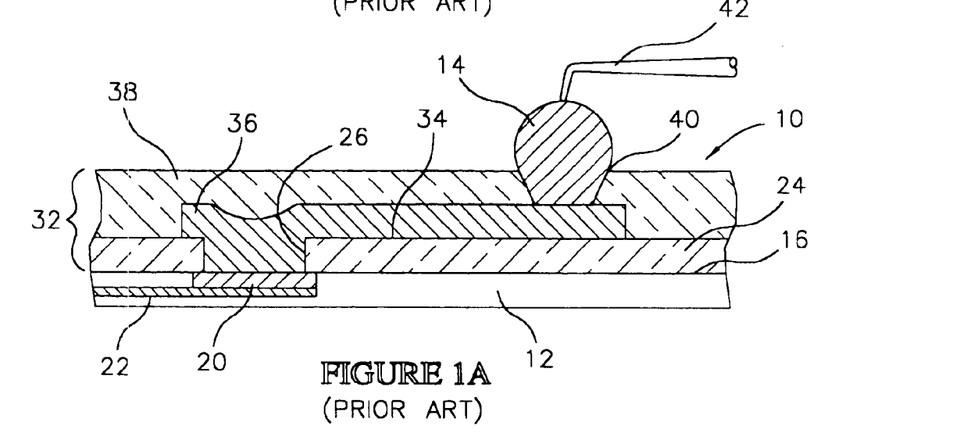
FIG. 1A is an enlarged cross sectional view taken along section line 1A—1A of FIG. 1 illustrating a redistribution circuit on the prior art package.

FIGS. 1 and 1A illustrate a bumped semiconductor component which comprises a "flip chip" semiconductor package 10. The package 10 includes a semiconductor die 12, and an array of bumped contacts 14 bonded to a face 16 (circuit side) of the die 12. The bumped contacts 14 allow the package 10 to be surface mounted to a mating substrate, such as a printed circuit board (PCB). Typically, the bumped contacts 14 are made of solder, such that the package 10 can be bonded to the mating substrate using a solder reflow process. In addition, the bumped contacts 14 can be arranged in a dense array, such as a ball grid array (BGA), or a fine ball grid array (FBGA), to provide a high input/output capability for the package 10. Further, the bumped contacts 14 can have a spherical, hemispherical, conical, dome or other shape.

The die 12 contained in the package 10 includes a pattern of die contacts 20 (e.g., bond pads) in electrical communication with the bumped contacts 14. In addition, the die 12 includes internal conductors 22 in electrical communication with the die contacts 20, and with various semiconductor devices and integrated circuits formed on the die 12. The die 12 also includes a passivation layer 24 formed on the face 16 of the die 12, and openings 26 through the passivation layer 24 to the die contacts 20. Typically, the passivation layer 24 comprises a glass, such as borophosphosilicate glass (BPSG), an oxide, such as $SiO_2$, or a polymer, such as polyimide.

The die 12 also includes a redistribution circuit 32 formed on a surface 34 of the passivation layer 24, which interconnects the bumped contacts 14 to the die contacts 20. The redistribution circuit 32 includes a pattern of conductors 36 in electrical communication with the die contacts 20, and an outer passivation layer 38 which covers the conductors 36. The conductors 36 can have a "fan out" configuration to provide a required pitch and pattern for the bumped contacts 14.

Redistribution circuits are typically used in semiconductor manufacture to "fan out" the signals from standard wire bond pads, to pads of a dense area array, such as a ball grid array (BGA). In an ideal situation, the die 12 would be designed to have the die contacts 20 in a pattern that does not require the redistribution circuit 32 to be added. For example, a semiconductor manufacturer can design the die 12 and the die contacts 20 such that the die contacts 20 are already in a grid array, for attaching solder balls of a ball grid array (BGA). However, as this ideal situation does not always exist, redistribution circuits are widely used in semiconductor manufacture.

Figures 1B, 2, 2A:
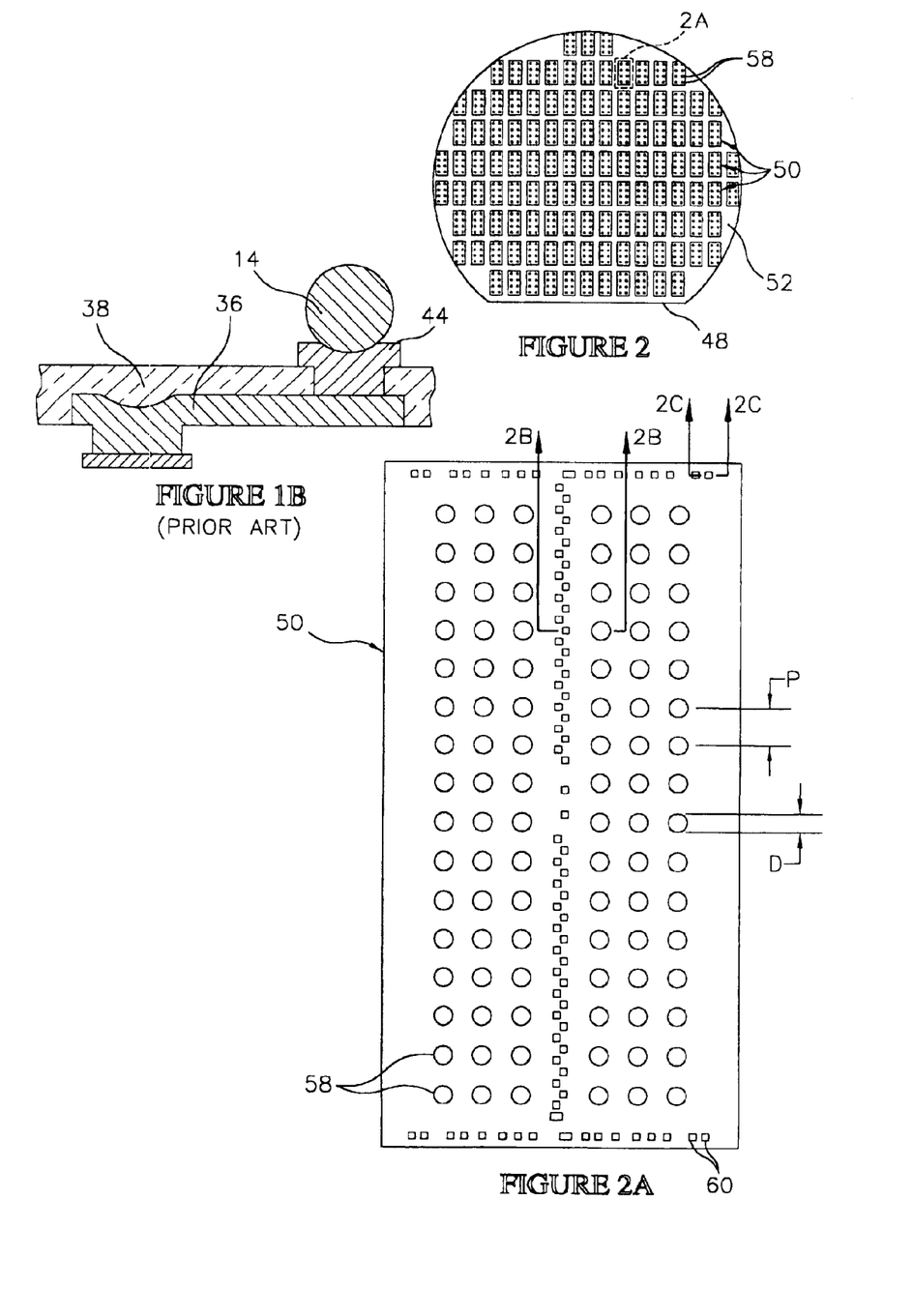
FIG. 1B is an enlarged cross sectional view equivalent to FIG. 1A illustrating the redistribution circuit on the prior art package with an under bump metallization (UBM)
FIG. 2 is a plan view of a wafer sized semiconductor component constructed in accordance with the invention.
FIG. 2A is an enlarged view taken along line 2A of FIG. 2 illustrating a singulated semiconductor component constructed in accordance with the invention.

The outer passivation layer 38 of the redistribution circuit 32 insulates the conductors 36, and helps to locate the bumped contacts 14. In addition, the outer passivation layer 38 functions as a solder mask to prevent solder from flowing between the bumped contacts 14 during attachment of the bumped contacts 14, and during surface mounting of the package 10. The outer passivation layer 38 can comprise a dielectric material. Suitable materials for the outer passivation layer 36 include polymers such as polyimide, glasses, such as BPSG, or oxides, such as $SiO_2$. The outer passivation layer 38 includes openings 40, and the bumped contacts 14 are located within the openings 40, and bonded to the conductors 36. As shown in FIG. 1B, the redistribution circuit 32 can also include an under bump metallization layer (UBM) 44, for each bumped contact 14 to facilitate bonding to the conductors 36.

For performing test procedures on the package 10 it is necessary to make temporary electrical connections with the bumped contacts 14. Different types of interconnects have been developed for making these temporary electrical connections.

One type of interconnect, typically used for testing components at the wafer level, is known as a "probe card". Probe cards are typically utilized to test dice contained on a semiconductor wafer prior to dicing of the wafer into individual dice. Probe cards can also be used to test other semiconductor components, such as the packages 10 contained on a wafer, on a panel, or on leadframe.

A needle probe card includes contacts in the form of needle probes 42 (FIG. 1A) which are configured to electrically engage the bumped contacts 14. Another type of probe card, manufactured by Wentworth Labs of Brookfield, Conn., is known as a "COBRA" probe card, and includes contacts in the form of buckle beams. Another type of probe card, manufactured by Form Factor, of Elmsford N.Y. includes contacts in the form of wires shaped as spring segments. Still another type of probe card, as described in U.S. Pat. No. 5,894,161 to Akram et al., includes silicon contacts covered with a conductive layer.

In addition to probe cards, another type of interconnect is used to test singulated components. For example, for testing singulated components such as dice or packages, the interconnect can be contained within a carrier adapted to temporarily package one or more components. U.S. Pat. Nos. 5,896,036; 5,844,418; and 5,878,485 to Wood et al.; U.S. Pat. No. 5,783,461 to Hembree; and U.S. Pat. No. 5,815,000 to Farnworth et al. describe carriers for singulated components.

With these carrier-type interconnects, the contacts can comprise projections configured to penetrate the bumped contacts 14, or alternately indentations configured to retain the bumped contacts 14. U.S. Pat. No. 5,894,161 to Akram et al. and U.S. Pat. No. 5,962,291 to Farnworth et al. describe this type of interconnect.

Regardless of the type of interconnect, problems can arise in making the temporary electrical connections with the bumped contacts 14. For example, bumped contacts 14 formed of a relatively soft material, such as solder, tend to produce flakes during testing. These flakes can contaminate the equipment used to conduct the test procedures. In addition, solder, and contaminants attracted to the solder, can build up on the interconnect contacts. This build up can increase electrical resistivity through the contacts, and adversely affect the test procedures. Needle probes 42 (FIG. 1A), for example, can only be used for several hundred touch downs on bumped contacts 14 formed of solder before they require cleaning.

Another problem during testing of bumped components, particularly with bumped contacts 14 formed of solder, is that the bumped contacts 14 deform easily during handling and testing, especially at elevated temperatures. For performing test procedures, it may be difficult to make low resistance electrical connections with deformed bumped contacts 14. Also for subsequent bonding procedures, the deformed bumped contacts 14 can make alignment and bonding of the component to a mating substrate more difficult. In addition, deformed bumped contacts 14 are a cosmetic problem that can adversely affect a users perception of a semiconductor component. Still further, the bumped contacts 14 can be separated from the component 10 during electrical engagement by the interconnect contacts.

In view of the foregoing problems associated with testing bumped semiconductor components, improved bumped semiconductor components capable of being more easily tested, are needed in the art. Also needed are improved test procedures and test systems for testing bumped semiconductor components.

SUMMARY OF THE INVENTION

In accordance with the present invention, a bumped semiconductor component, a method for testing bumped semiconductor components, and a system for testing bumped semiconductor components are provided.

The semiconductor component includes a semiconductor die having a face, and a plurality of die contacts, such as bond pads in electrical communication with integrated circuits contained on the die. The semiconductor component can be contained on a wafer, or alternately can comprise a singulated component. In the illustrative embodiment the semiconductor component comprises a flip chip package.

In addition to the die, the semiconductor component includes an array of external bumped contacts, and a redistribution circuit which interconnects the bumped contacts to the die contacts. The redistribution circuit includes a pattern of conductors on the face of the die in electrical communication with the die contacts, and with the bumped contacts; and an outer passivation layer for protecting the conductors and for locating the bumped contacts.

The redistribution circuit also includes a plurality of test contacts in electrical communication with the conductors and with the bumped contacts. The test contacts are configured for electrical engagement by interconnect contacts, such as needle probes of a probe card, to permit test procedures to be conducted without electrical engagement of the bumped contacts. In the illustrative embodiment, the test contacts comprise openings in the outer passivation layer aligned with selected portions of the conductors. In addition, the test contacts can be aligned with the die contacts, which permits the component to be tested using an interconnect that is also configured to test the bare die. Alternately, the test contacts can comprise selected portions of conductors without an outer passivation layer, or can comprise separate pads in electrical communication with the conductors.

The test contacts and the bumped contacts are configured to allow the interconnect contacts to electrically engage the test contacts without interference from the bumped contacts. This can be accomplished by configuring the test contacts and the bumped contacts such that the interconnect contacts can be placed within the spaces between adjacent bumped contacts. In addition, the interconnect contacts can have a shape, and a height, selected to physically contact the test contacts but not the bumped contacts.

The test method includes the steps of: providing a semiconductor component comprising a die having bumped contacts, and a redistribution circuit comprising conductors and test contacts in electrical communication with the bumped contacts; electrically engaging the component using an interconnect having interconnect contacts configured to physically contact the test contacts without interference from the bumped contacts; and then applying test signals through the interconnect contacts and the test contacts to the integrated circuits contained on the die.

The test system includes: the component comprising the die and the redistribution circuit having the conductors and the test contacts; a testing apparatus, such as a wafer prober, configured to generate electrical test signals; and the interconnect on the testing apparatus having interconnect contacts configured to electrically engage the test contacts.

An alternate embodiment test system includes a carrier configured to temporarily package one or more singulated components in electrical communication with the interconnect.

DETAILED DESCRIPTION OF THE PREFERRED EMBODIMENT

As used herein, the term "semiconductor component" refers to an electronic component that includes a semiconductor die. Exemplary semiconductor components include bare semiconductor dice, chip scale packages, ceramic or plastic semiconductor packages, BGA devices, semiconductor wafers, and panels and leadframes containing multiple dice or chip scale packages.

Figure 2B:
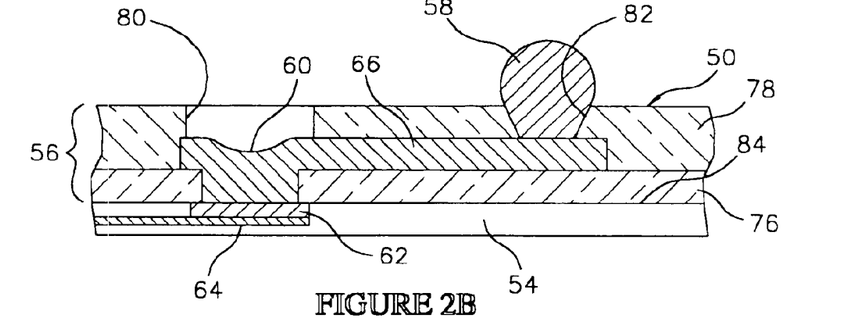
FIG. 2B is an enlarged cross sectional view taken along section line 2B—2B of FIG. 2A illustrating a test contact and a bumped contact on the singulated component.
Figures 2C, 3A, 3B, 3C, 3D:
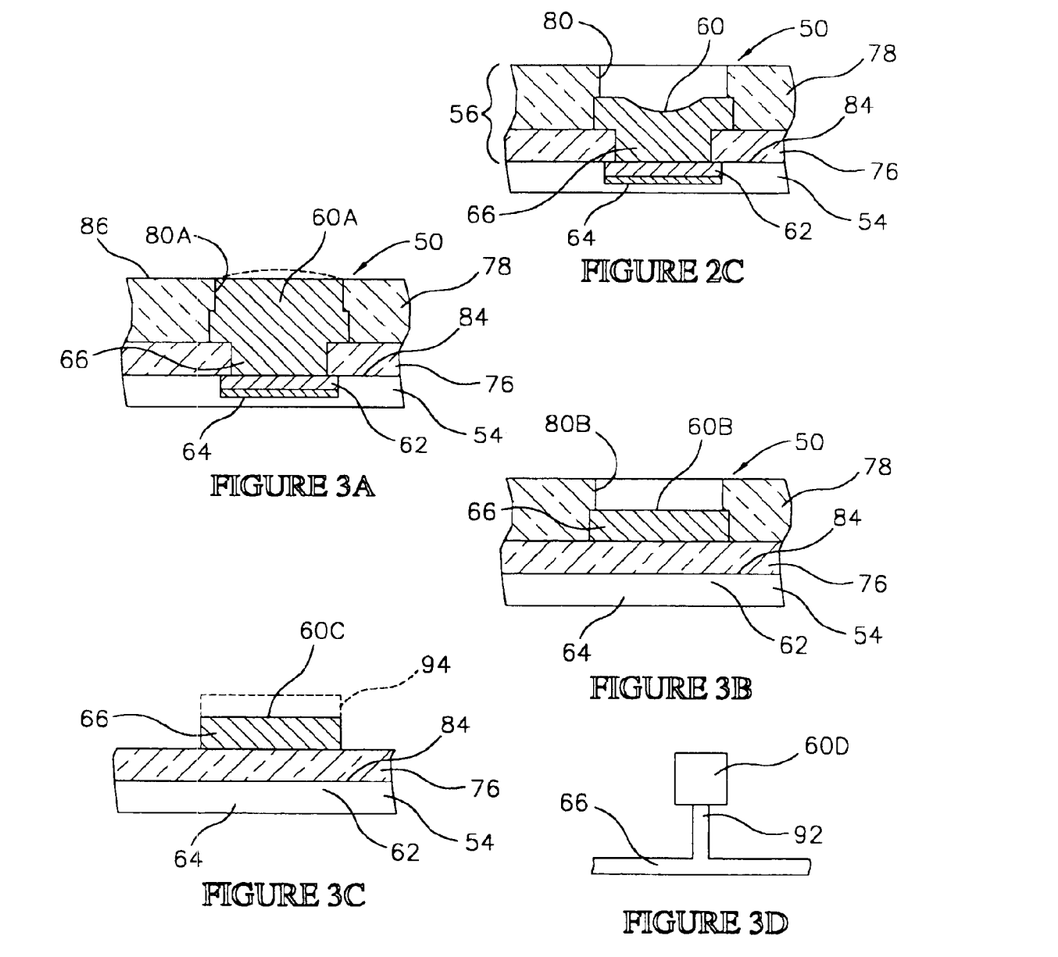
FIG. 2C is an enlarged cross section taken along section line 2C—2C of FIG. 2A illustrating a test contact on the singulated component.
FIG. 3A is an enlarged cross sectional view equivalent FIG. 2C of an alternate embodiment test contact having an increased thickness.
FIG. 3B is an enlarged cross sectional view equivalent to FIG. 2C of an alternate embodiment test contact aligned with a portion of a conductor.
FIG. 3C is an enlarged cross sectional view equivalent to FIG. 2C of an alternate embodiment test contact comprising a selected portion of a conductor.
FIG. 3D is an enlarged plan view of an alternate embodiment test contact comprising a separate pad in electrical communication with a conductor.

Referring to FIGS. 2–2C, a bumped semiconductor component 50 constructed in accordance with the invention is illustrated. As shown in FIG. 2, the semiconductor component 50 can be contained on a wafer 52 which comprises a plurality of components 50. Although the wafer 52 is illustrated as being generally circular in shape with a major flat, the semiconductor component 50 can be contained on a wafer, or portion thereof, having a different shape than the wafer 52. The component 50 can also be contained on a panel, or on a leadframe.

Alternately, the semiconductor component 50 can be a singulated component which has been separated from the wafer 52. In FIG. 2A the semiconductor component 50 is shown in singulated form, and comprises a flip chip semiconductor package.

As shown in FIG. 2B, the component 50 includes a semiconductor die 54, a redistribution circuit 56 on the die 54, and a plurality of bumped contacts 58 on the redistribution circuit 56. The redistribution circuit 56 includes a plurality of conductors 66 in electrical communication with the bumped contacts 58, and a plurality of test contacts 60 configured to permit testing of the die 54 without electrical engagement of the bumped contacts 58.

The die 54 can comprise a conventional semiconductor die 54 having a desired electrical configuration. For example, the die 54 can be a memory device, such as a DRAM or SRAM. In the illustrative embodiment, the die 54 and the component 50 are generally rectangular in shape, but other shapes such as square can be utilized. The die 54 includes a pattern of die contacts 62, such as rectangular, square or other shapes of bond pads embedded within a die passivation layer 76. The die contacts 62 and the die passivation layer 76 are located on a face 84 (circuit side) of the die 54, with the die contacts 62 located below the level of the die passivation layer 76. The die passivation layer 76 can comprise an electrically insulating material such as BPSG or $SiO_2$.

The die contacts 62 can comprise a thin film aluminum layer, or another electrically conductive material. In addition, the die contacts 62 can have a conventional shape (e.g., square or rectangular), a conventional size (e.g., 25 to 200 $\mu$m on a side), and can be arranged in a conventional configuration (e.g., edge connect, end connect, LOC). In the illustrative embodiment the die contacts 62 are located along the center line of the die 54, and along opposed lateral edges of the die 54. The die 54 includes internal conductors 64 in electrical communication with the die contacts 62 and with various semiconductor devices and electrical circuits contained on the die 54.

The conductors 66 of the redistribution circuit 56 are also in electrical communication with the die contacts 62. The conductors 66 can be formed on the die passivation layer 76 using a conventional deposition process such as CVD, PECVD, PVD, sputtering or evaporation, followed by photopatterning and etching. Suitable materials for the conductors 66 include aluminum, chromium, titanium, nickel, iridium, copper, gold, tungsten, silver, platinum, palladium, tantalum, molybdenum or alloys of these metals, such as $TiSi_2$.

In the illustrative embodiment the conductors 66 "fan out" from the pattern and pitch of the die contacts 62 to the pattern and pitch of the bumped contacts 58. In addition, the bumped contacts 58 are arranged in a grid array composed of rows and columns. However, the conductors 66 can also have a "fan in" configuration, such as would occur with the die contacts 62 located along peripheral edges of the die 54 (e.g., edge connect die, end connect die). In this case the conductors 66 would "fan in" from the edges of the die 54 into the grid array of the bumped contacts 58. Also, rather than a grid array the bumped contacts 58 can be arranged in other configurations such as a perimeter pattern.

The redistribution circuit 56 also includes an outer passivation layer 78 formed over the conductors 66. The bumped contacts 58 are located in openings 82 formed through the outer passivation layer 78 to selected portions of the conductors 66. In the illustrative embodiment, the bumped contacts 58 comprise solder balls bonded to the conductors 66 using a conventional process. The conductors 66 can also include an under bump metallization layer 44 (FIG. 1B) to facilitate bonding to the conductors 66. Typically, solder ball bonding is performed by applying flux to the conductors 66, and to the solder balls. The solder balls are then placed in the openings 82, and the assembly is placed in an oven wherein the solder is reflowed. This forms the bumped contacts 58, and a metallurgical solder bond between the bumped contacts 58 and the conductors 66.

The bumped contacts 58 provide electrical connection points from the outside world to the component 50. In the illustrative embodiment, the bumped contacts 58 are arranged in a ball grid array composed of six rows and sixteen columns. However, as is apparent, other dense area arrays, or patterning arrangements, can be used for locating the bumped contacts 58. The bumped contacts 58 permit the component 50 to be flip chip mounted circuit side down to mating electrodes on a supporting substrate, such as a circuit board.

In addition, the number of bumped contacts 58, the diameter D (FIG. 2A) of the bumped contacts 58, and a pitch P (FIG. 2A) of the bumped contacts 58 can be selected as required. A representative diameter D can be from about 0.005-in (0.127 mm) to about 0.016-in (0.400 mm) or larger.

A representative pitch P can be from about 0.004-in (0.100 mm) to about 0.039-in (1.0) mm or more.

The outer passivation layer 78 of the redistribution circuit 56 comprises a dielectric material blanket deposited the face 84 of the die 54, and adapted to insulate and protect the conductors 66. However, it is to be understood that the redistribution circuit 56 can be constructed without the outer passivation layer 78. Also, rather than being blanket deposited, the outer passivation layer 78 can be patterned to cover selected areas on the face 84, such as just the surfaces of the conductors 66.

In the illustrative embodiment, the outer passivation layer 78 also functions as a solder mask to prevent bridging of solder material between the bumped contacts 58 during fabrication of the component 50, and during surface mounting of the component 50. The outer passivation layer 78 also prevents the solder from wicking across the conductors 66 which can reduce the height of the bumped contacts 58.

The outer passivation layer 78 of the redistribution circuit 56 can comprise a deposited polymer, such as polyimide, a glass, such as BPSG, or an oxide such as $SiO_2$. The outer passivation layer 78 can also comprise a photoimageable material, such as photoimageable polyimide, that can be blanket deposited as a wet or dry film, exposed through a mask, developed, and then cured. Exposure and development of the photoimageable material forms the openings 82 in a required pattern and with required diameters. The openings 82 can also be formed using an etchant and a mask, such as a photoimageable resist mask.

As also shown in FIG. 2B, the test contacts 60 comprise openings 80 in the outer passivation layer 78 aligned with the die contacts 62. As will be further explained, if the outer passivation layer 78 is not provided, then the test contacts 60 can comprise selected portions of the conductors 66, or alternately separate pads in electrical communication with the conductors 66.

The openings 80 can be formed substantially as previously described for the openings 82. Also in the illustrative embodiment, the openings 80 have a geometrical shape (e.g., square or rectangular), and a size (e.g., 25 to 200 µm on a side) that are substantially equivalent to the shape and size of the die contacts 62. A depth of the openings 80 will be approximately equal to the thickness of the outer passivation layer 78 measured from the face 84 of the die 54, minus the thickness of the conductors 66 measured from the face 84 of the die 54.

An alternate embodiment test contact 60A, which is illustrated in FIG. 3A, comprises an opening 80A formed substantially as previously described for opening 80, but with a conductive material deposited within the opening 80A. In this embodiment the test contact 60A has an outer surface that is generally planar to the outer surface 86 of the outer passivation layer 78. Alternately, as indicated by the dotted lines in FIG. 3A, the test contact 60A can comprise a pad which is raised, or "built up", relative to the outer surface 86 of the outer passivation layer 78. The conductive material can comprise an additional metal layer deposited within the opening 80A onto a selected portion of the conductor 66. However, in the illustrative embodiment the test contact 60A is formed in alignment with the die contact 62.

An alternate embodiment test contact 60B, which is illustrated in FIG. 3B, comprises an opening 80B in the outer passivation layer 78 aligned with a selected portion of the conductor 66, but not necessarily in alignment with the die contact 62. This embodiment can also be made planar, or can be a pad that is raised with respect to the surface 86 of the outer passivation layer 78, using an additional metal layer (not shown) substantially as shown in FIG. 3A.

An alternate embodiment test contact 60C, which is illustrated in FIG. 3C, comprises a selected portion of the conductor 66. In this embodiment the outer passivation layer 78 is eliminated. In addition, this embodiment the test contact 60C can include a conductive pad 94 on the conductor 66, as indicated by the dotted line in FIG. 3C. Also, the conductive pad 94 can comprise a non-oxidizing metal such as Au, or Pt. This insures a low resistance electrical connection to the test contact 60C without a build up of native oxide layers.

An alternate embodiment test contact 60D, which is shown in FIG. 3D, comprises a separate pad in electrical communication with the conductor 66. In this embodiment the test contact 60D can be located in a pattern as required. In addition, a conductive segment 92, substantially similar to the conductor 66, electrically connects the test contact 60D to the conductor 66. As with the previous embodiment the test contact 60D can comprise a non-oxidizing metal.

Figure 4:
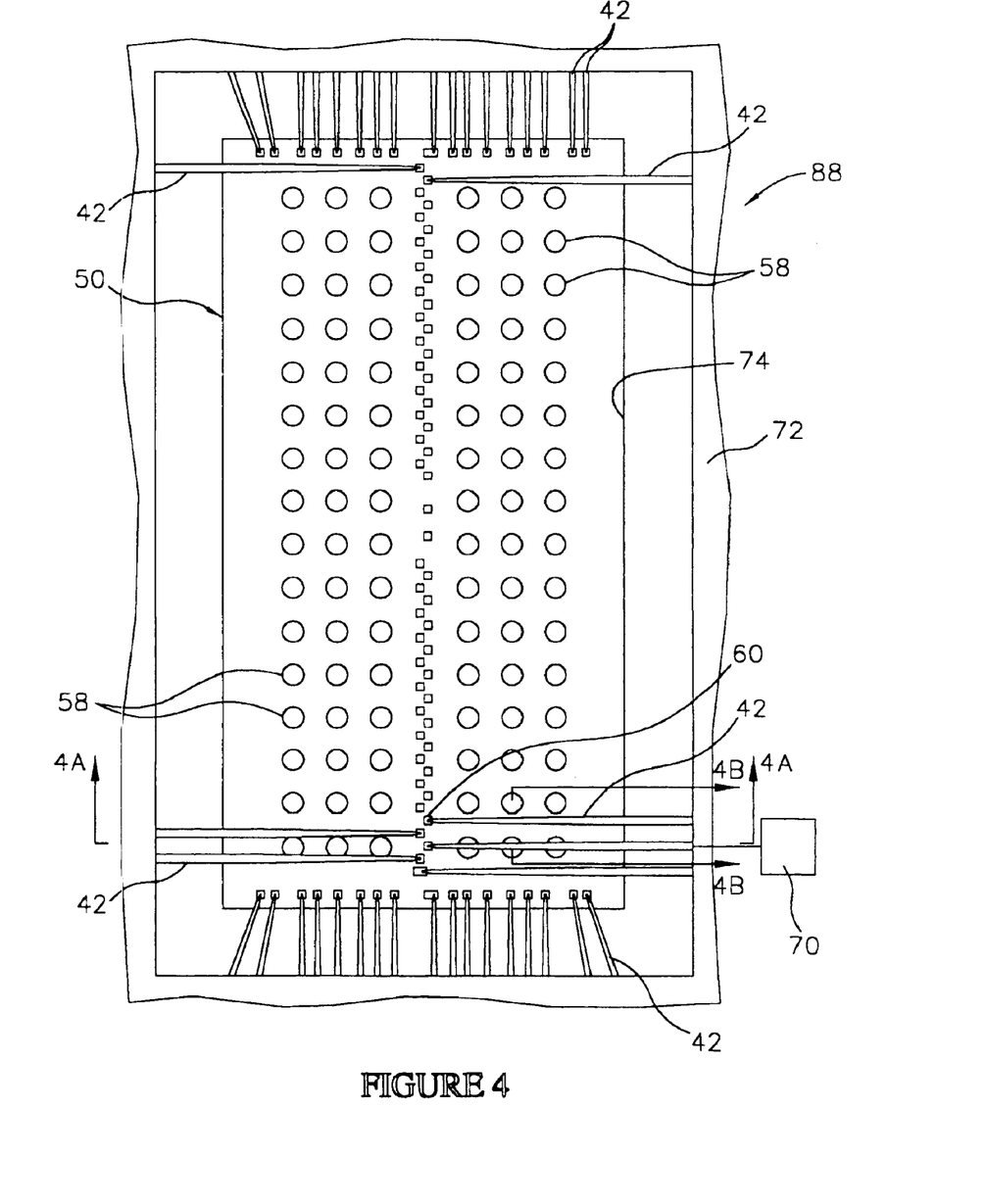
FIG. 4 is an enlarged schematic plan view of a test system constructed in accordance with the invention.
Figure 4A:
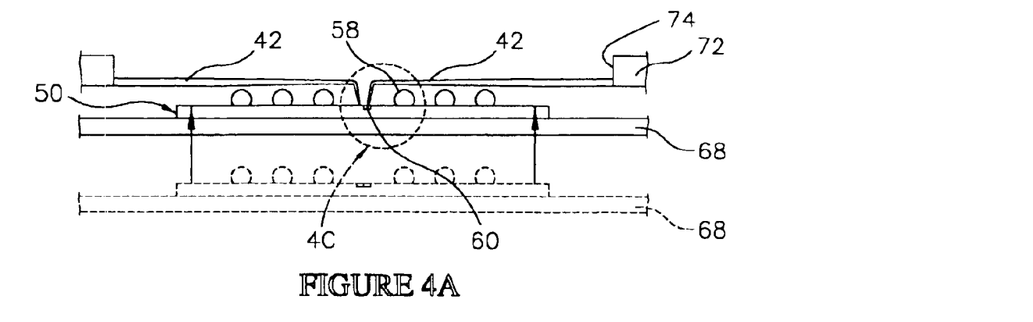
FIG. 4A is a cross sectional view taken along section line 4A—4A of FIG. 4.
Figure 4B:
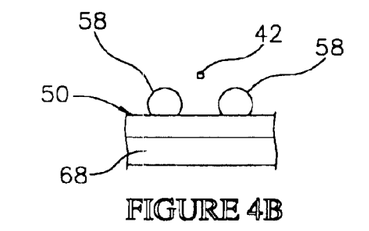
FIG. 4B is a cross sectional view taken along section line 4B—4B of FIG. 4.
Figure 4C:
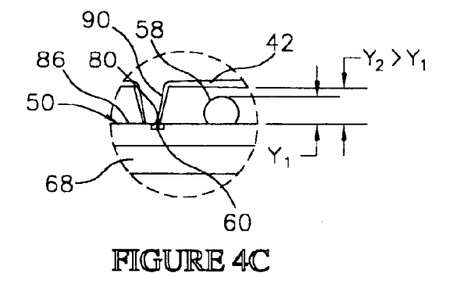
FIG. 4C is an enlarged portion of FIG. 4A taken along line 4C.

Referring to FIGS. 4–4C, a test system 88 constructed in accordance with the invention is illustrated. The test system 88 includes the component 50 having bumped contacts 58, and the redistribution circuit 56 with test contacts 60, as previously described. For illustrative purposes, the component 50 is illustrated in singulated form. However, the component 50 can also be contained on a wafer 52 (FIG. 2) as previously described.

In addition to the component 50, the test system 88 includes an interconnect 72 having interconnect contacts in the form of needle probes 42 configured to electrically engage the test contacts 60. As will be further explained, the needle probes 42 can be shaped and dimensioned to physically contact the test contacts 60 but not the bumped contacts 58. In addition, the test contacts 60 and the bumped contacts 58 can be sized and located relative to one another such that the needle probes 42 can physically contact the test contacts 60 but not the bumped contacts 58.

The test system 88 also includes test circuitry 70 in electrical communication with the needle probes 42. The test circuitry 70 is adapted to generate and transmit test signals through the needle probes 42 to the test contacts 60 for evaluating various electrical characteristics of the component 50. Conventional test circuitry 70 is commercially available from manufacturers such as Teradyne Inc. of Boston, Mass.

The test system 88 also includes a testing apparatus 68 (FIG. 4A) configured to support the component 50 and the interconnect 72, to align the component 50 to the interconnect 72, and to move the component 50 into electrical engagement with the needle probes 42. The testing apparatus 68 can be a conventional wafer probe apparatus or wafer handler. For example suitable testing apparatus 68 are manufactured by Electroglas, Inc. of Santa Clara, Calif.

The testing apparatus 68 can also include a probe card mounting fixture (not shown) for mounting the 72. In the illustrative embodiment the testing apparatus is adapted to move the component 50 in x and y directions to align the needle probes 42 with the test contacts 60, and then to move the component in the z direction such that the test contacts 60 physically touch the needle probes 42. Alternately, the testing apparatus 68 can be configured such that the interconnect 72 is moved in x, y and z directions and the component 50 is held stationary.

The needle probes 42, the test contacts 60, and the bumped contacts 58 are configured such that the needles probes 42 can electrically engage the test contacts 60 without interference from the bumped contacts 58. Two different techniques for configuring the needle probes 42 and the bumped contacts 58 to avoid contact of the needle probes 42 and the bumped contacts 58 are illustrated in FIGS. 4B and 4C.

In FIG. 4B, the needle probes 42 and the bumped contacts 58 are configured such that the needle probes 42 occupy the space between adjacent bumped contacts 58. In the case of alternate embodiment test contacts 60B (FIG. 3B), the test contacts 60B can be located anywhere along the length of the conductors 66. Accordingly, there is greater latitude in locating the test contacts 60B to avoid interference of the needle probes 42 and the bumped contacts 58.

In FIG. 4C, the needle probes 42 are constructed with tip portions 90 that are generally orthogonal to the major plane of the needle probes 42. In addition, the tip portions 90 of the needle probes 42 have a height $Y_2$ measured from the lower surfaces of the needle probes 42 to the surface 86 of the component 50. On the other hand, the bumped contacts 58 have a height $Y_1$ measured from the surface 86 of the component 50. During construction of the interconnect 72 and the component 50, $Y_2$ and $Y_1$ are selected such that $Y_2$ is greater than $Y_1$ ($Y_2 > Y_1$). This allows the needle probes 42 to clear the bumped contacts 58 while physically contacting the test contacts 60. Such an arrangement can be utilized, as shown in FIG. 4A, wherein the component 50 is moved in the z-direction into physical engagement with the interconnect 72.

In the illustrative embodiment, wherein the test contacts 60 are aligned with the die contacts 62, the same interconnect 72 can be used to test either the bare die 54 or the component 50. The alternate embodiment test contacts 60A (FIG. 3A) are configured to decrease the distance the component 50 must be moved by the testing apparatus 68 (FIG. 4A) in the z-direction such that the test contacts 60A physically contact the needle probes 42.

Figure 5A:
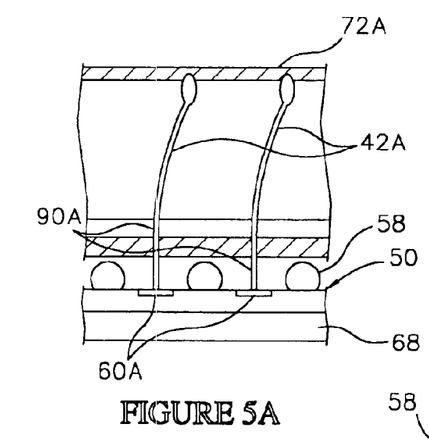
FIG. 5A is an enlarged cross sectional view equivalent to FIG. 4C of an alternate embodiment test system.
Figure 5B:
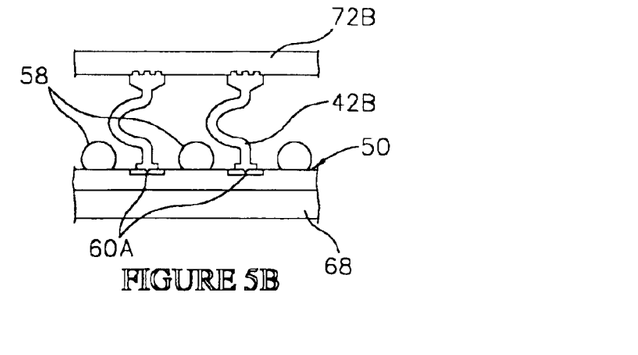
FIG. 5B is an enlarged cross sectional view equivalent to FIG. 4C of an alternate embodiment test system.
Figure 5C:
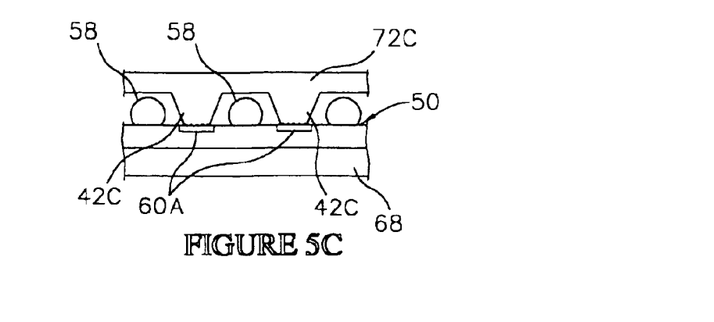
FIG. 5C is an enlarged cross sectional view equivalent to FIG. 4C of an alternate embodiment test system.

FIGS. 5A–5C illustrate alternate embodiment interconnects 42A–42C that can be substituted for the interconnect 42 in the test system 88. In FIG. 5A, an interconnect 72A includes interconnect contacts in the form of buckle beam probes 42A configured to electrically engage the test contacts 60 on the component 50. The interconnect 72A can be similar to buckle beam probe cards manufactured by Wentworth Laboratories, Brookfield, Conn. However, the buckle beam probes 42A are configured to physically engage the test contacts 60 without interference from the bumped contacts 58. One method for avoiding interference is to construct the buckle beam probes 42A with movable tip portions 90A having a height that is greater than the height of the bumped contacts 58.

In FIG. 5B, an interconnect 72B includes interconnect contacts in the form of spring segment probes 42B configured to electrically engage the test contacts 60 on the component 50. The interconnect 72B can be similar to probe cards manufactured by Form Factor, of Elmsford N.Y. Again, the spring segment probes 42B are configured to physically engage the test contacts 60 without interference from the bumped contacts 58. One method for avoiding interference is to construct the spring segment probes 42A with a height that is greater than the height of the bumped contacts 58.

In FIG. 5C, an interconnect 72C includes interconnect contacts in the form of silicon probes 42C covered with a conductive layer (not shown). This type of interconnect is described in U.S. Pat. Nos. 5,894,161 and 5,686,317 to Akram et al., which are incorporated herein by reference. Again, the silicon probes 42C are configured to physically engage the test contacts 60 without interference from the bumped contacts 58. One method for avoiding interference is to construct the silicon probes 42C with a height that is greater than the height of the bumped contacts 58.

Singulated Component Test System

Figures 6A, 6B:
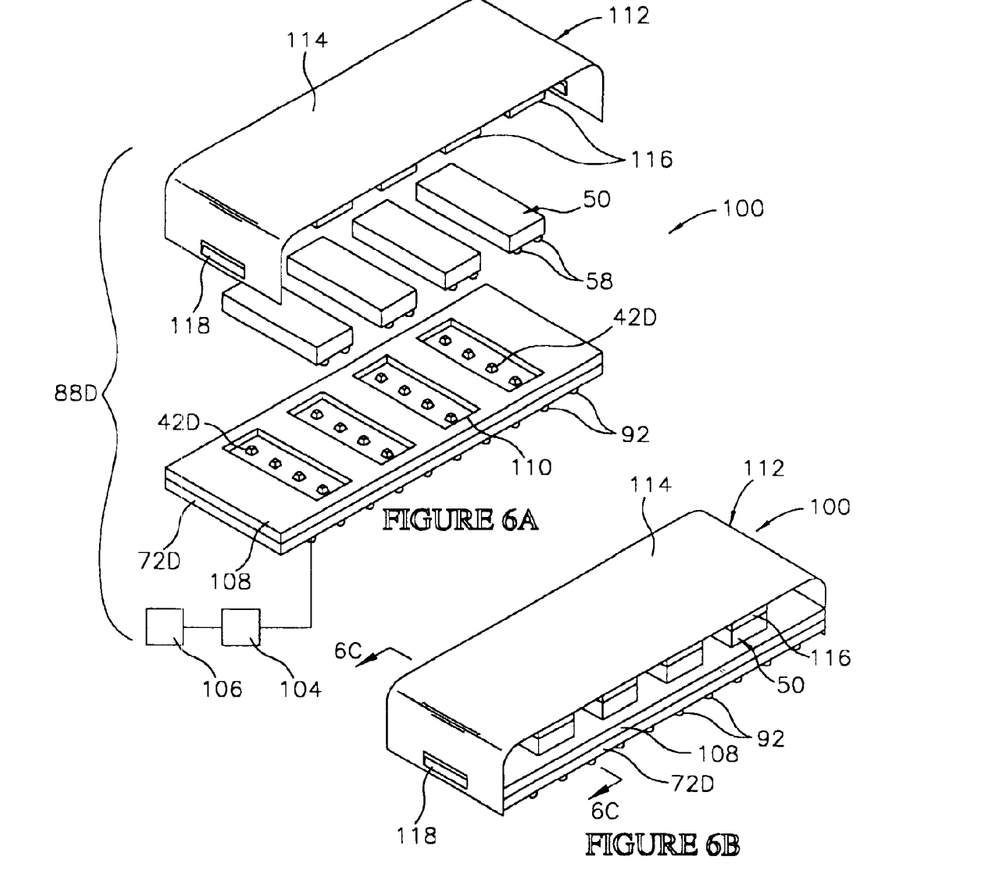
FIG. 6A is an exploded schematic perspective view of a test system constructed in accordance with the invention for testing singulated components.
FIG. 6B is a schematic perspective view of an assembled test carrier of the test system.
Figure 6C:
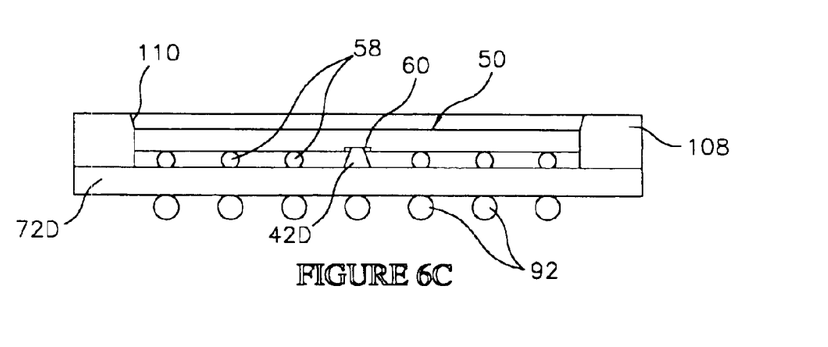
FIG. 6C is an enlarged schematic cross sectional view, with parts removed, of the test carrier taken along section line 6C—6C of FIG. 6B.

Referring to FIGS. 6A–6C, a test system 88D constructed in accordance with the invention is illustrated. The test system 88D includes a test carrier 100 adapted to temporarily package four semiconductor components 50 in singulated form, for test and burn-in. Using the test system 88D the components 50 can be tested by electrically engaging the test contacts 60 (FIG. 6C) rather than the bumped contacts 58.

The test carrier 100 includes an interconnect 42D having a plurality of interconnect contacts 42D configured to physically and electrically engage the test contacts 60 on the components 50. As with the previous embodiments, the interconnect contacts 42D have a height that is greater than the height of the bumped contacts 58, such that the test contacts 60 can be physically contacted without interference from the bumped contacts 58.

The test carrier 100 also includes a plurality of terminal contacts 102 in electrical communication with the interconnect contacts 42D. The terminal contacts 102 are adapted to electrically engage mating electrical connectors (not shown) on a test apparatus 104 (FIG. 6A), such as a burn-in board. The test apparatus 104 includes, or is in electrical communication with test circuitry 106, adapted to apply test signals to the integrated circuits contained on the components 50, and to analyze the resultant signals.

The test carrier 100 also includes an alignment member 108 adapted to align the components 50, to the interconnect 72D such that the interconnect contacts 42D electrically engage the test contacts 60 (FIG. 6C). The alignment member 108 includes openings 110 configured to contact the peripheral edges of the components 50 to guide the components 50 onto the interconnect 72D.

The alignment member 108 can be constructed, as described in U.S. Pat. No. 5,559,444, entitled "METHOD AND APPARATUS FOR TESTING UNPACKAGED SEMICONDUCTOR DICE", incorporated herein by reference. As another alternative, the alignment member 108 can be eliminated and the components 50 can be aligned with the interconnect 72D using an optical alignment technique. Such an optical alignment technique is described in U.S. Pat. No. 5,796,264, entitled "APPARATUS FOR MANUFACTURING KNOWN GOOD SEMICONDUCTOR DICE", which is incorporated herein by reference.

As shown in FIGS. 6A and 6B, the test carrier 100 also includes a force applying mechanism 112 for biasing the components 50 against the interconnect 72D. The force applying mechanism 112 includes a clamp member 114 which attaches to the interconnect 72D, and a plurality of biasing members 116 for pressing the components 50 against the contacts 42D. In the illustrative embodiment, the biasing members 116 comprise elastomeric blocks formed of a polymer material such as silicone, butyl rubber, flourosilicone, or polyimide. Alternately the biasing members 116 can comprise leaf springs, flat springs, coil springs, gas bladders or liquid filled bladders. The clamp member 114 includes tabs 118 for engaging the interconnect 72D to secure the clamp member 114 to the interconnect 72D.

In the illustrative embodiment, the clamp member 114 attaches directly to the interconnect 72D which is configured to form a base for the test carrier 100. However, the test carrier 100 can include a separate base, and the interconnect 72D can be mounted to the base as is described in U.S. Pat. No. 5,519,332 to Wood et al.; U.S. Pat. No. 5,541,525 to Wood et al.; U.S. Pat. No. 5,815,000 to Farnworth et al.; and U.S. Pat. No. 5,783,461 to Hembree, all of which are incorporated herein by reference.

Thus the invention provides an improved bumped semiconductor component with test pads, a method for testing bumped semiconductor components using test pads, and a system for testing bumped semiconductor components.

While the invention has been described with reference to certain preferred embodiments, as will be apparent to those skilled in the art, certain changes and modifications can be made without departing from the scope of the invention as defined by the following claims.

What is claimed is:

1. A semiconductor component comprising:

a semiconductor die having a face and a plurality of die contacts on the face in a pattern;

a redistribution circuit comprising a plurality of conductors on the face in electrical communication with the die contacts configured to redistribute the pattern of the die contacts into an area array, and a plurality of test contacts in electrical communication with the conductors; and a plurality of bumped contacts in the area array in electrical communication with the conductors;

the test contacts configured to permit testing of the die without electrical engagement of the bumped contacts.

2. The component of claim 1 wherein the test contacts comprise portions of the conductors.

3. The component of claim 1 wherein the redistribution circuit includes an electrically insulating layer on the conductors.

4. The component of claim 1 wherein the test contacts include non oxidizing layers.

5. The component of claim 1 wherein the die has a plurality of edges and the conductors fan out the pattern of the die contacts to the edges.

6. The component of claim 1 wherein the die has a plurality of edges and the conductors fan in the pattern of the die contacts from the edges.

* * * * *